(12) United States Patent
Tran et al.

(10) Patent No.: US 6,203,621 B1
(45) Date of Patent: Mar. 20, 2001

(54) VACUUM CHUCK FOR HOLDING THIN SHEET MATERIAL

(75) Inventors: Dean Tran, Westminster; David M. Carberry; David H. Boger, both of Redondo Beach; George J. Vendura, Jr., Rossmoor; Alan M. Hirschberg, Thousand Oaks, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/316,991

(22) Filed: May 24, 1999

(51) Int. Cl.[7] .............................. C23C 16/00; B25B 11/00
(52) U.S. Cl. .................... 118/728; 118/729; 118/715; 269/21
(58) Field of Search .................... 118/728, 729, 118/715; 269/21

(56) References Cited

U.S. PATENT DOCUMENTS

| | | | |
|---|---|---|---|
| 5,671,910 | * 9/1997 | Davis et al. | 269/21 |
| 5,863,338 | * 1/1999 | Yamada et al. | 118/719 |
| 5,899,445 | * 5/1999 | Kimble | 269/21 |
| 5,937,993 | * 8/1999 | Sheets et al. | 269/21 |

* cited by examiner

Primary Examiner—Gregory Mills
Assistant Examiner—Parviz Hassanzadeh
(74) Attorney, Agent, or Firm—Michael S. Yatsko

(57) ABSTRACT

A vacuum chuck (34) for holding thin sheet material, particularly during high-temperature manufacturing processes, and an apparatus (10) for forming a substantially uniform coating of a substance on a thin sheet material. The vacuum chuck includes a chuck body (36) having a gas-permeable support surface (38) for supporting the thin sheet material to define a vacuum chamber (49) having an inlet (54), a valve member (56) for controlling fluid flow through the vacuum chamber inlet, and a locking shim (58) for holding the valve member in the vacuum chamber inlet. The locking shim is responsive to the vacuum chamber inlet being coupled to a vacuum source for permitting the valve member to partially withdraw from the vacuum chamber inlet, to permit drawing of a vacuum in the vacuum chamber, supporting the thin sheet material on the gas-permeable support surface in a substantially flat position, and is responsive to the vacuum chamber inlet being removed from the vacuum source for inserting the valve member more fully into the vacuum chamber inlet, to seal the vacuum chamber and retain the vacuum therein, holding the thin sheet material on the gas-permeable support surface. One vacuum is attained, temperature excursions during the deposition process will cause the locking shim to press against the valve member with more force. Assuring a sound vacuum through the entire process. The manufacturing apparatus includes a conveyor (12) on which the vacuum chuck is conveyed, with the thin sheet material held thereon, and a source (60) of coating substance.

14 Claims, 3 Drawing Sheets

VACUUM CHUCK FOR HOLDING THIN SHEET MATERIAL

BACKGROUND OF THE INVENTION

The present invention pertains to a vacuum chuck for holding thin sheet material such as a glass substrate, and to an apparatus for forming a substantially uniform coating of a substance on a thin sheet material such as a glass substrate.

Thin substrates are used to manufacture numerous items and often require high-temperature processing during the manufacturing. By way of example, thin glass solar cell wafers are utilized for satellite power supply applications and frequently are formed by coating one or more substances on the glass substrates in a high-temperature processing zone. For example, an amorphous silicon coating might be formed on a 3 to 5 mil thick glass wafer in a chemical vapor deposition process at a high temperature. The coating must be uniform over the surface of the wafer, or the resulting coated glass wafer is not usable for its intended purpose.

Present processing techniques for forming a coating on thin substrates include conveying the substrates slowly through a series of processing zones, with significantly different temperatures in each zone. By way of example, the series of processing zones may have a total length in the order of ten feet and may be divided by baffles into three or more zones, with the first zone being heated to a temperature in the order of 200° C. the second zone heated to a temperature in the order of about 600° C. and the third zone heated to a temperature in the order of about 200° C. In some processes a different substance is coated on the substrates in each zone, while in other processes a substance is coated on the substrates in only a single one of the zones. The substrates might be conveyed through these zones at speeds as slow as one foot per minute or slower. Each substrate might have a length of about 12 inches or longer. Consequently, as a substrate moves from one zone to the next, for a significant period of time a portion of the substrate is in the higher temperature zone, while the remainder of the substrate is in the lower temperature zone. During this time a significant temperature gradient exists over the length of the substrate. This temperature gradient can result in the thin substrate warping. During the deposition of substances onto the substrate, such warping can cause non-uniform layer growth across the substrate. The resulting coated substrate is unsatisfactory due to this non-uniform coating.

Vacuum chucks with rubber valves have been used in some room temperatures processing techniques. However, the rubber valves are not able to withstand the high temperatures and corrosive atmospheres encountered in chemical vapor deposition as utilized in many manufacturing processes.

SUMMARY OF THE INVENTION

The present invention is a vacuum chuck for holding thin sheet material, for example a glass substrate, during processing, including high-temperature processing. In accordance with the present invention, the vacuum chuck includes a chuck body having a gas-permeable support surface for supporting the thin sheet material. When the thin sheet material is supported on the gas-permeable support surface, a vacuum chamber is formed within the chuck body. The vacuum chamber has an inlet adapted to be coupled to a vacuum source to permit a vacuum to be drawn in the vacuum chamber upon activation of the vacuum source. A valve member is positioned in the vacuum chamber inlet, and a locking shim holds the valve member in a position closing the vacuum chamber inlet. Activation of the vacuum source results in the locking shim and valve member moving to open the vacuum chamber inlet to permit drawing of a vacuum in the vacuum chamber. The locking shim and valve member are responsive to lack of activation of the vacuum source by sealing the vacuum chamber to retain the vacuum therein, holding the thin sheet material on the gas-permeable support surface. Thus, the vacuum is retained and the thin sheet material held in position even after the vacuum source is deactivated.

Preferably, the locking shim is formed of two layers of material having different coefficients of thermal expansion to cause the locking shim to curve when heated, more firmly inserting the valve member into the vacuum chamber inlet to more firmly seal the vacuum chamber.

Further in accordance with the present invention, an apparatus for forming a substantially uniform coating of a substance on thin sheet material such as a glass substrate is provided, including a vacuum chuck as set forth above, a conveyor for conveying the vacuum chuck having the thin sheet material supported on it through a coating zone, and a source of coating material in the coating zone for forming the coating on the thin sheet material.

BRIEF DESCRIPTION OF THE DRAWINGS

These and other aspects and advantages of the present invention are more apparent from the following detailed description and claims, particularly when considered in conjunction with the accompanying drawings. In the drawings:

DETAILED DESCRIPTION

Figure 1:
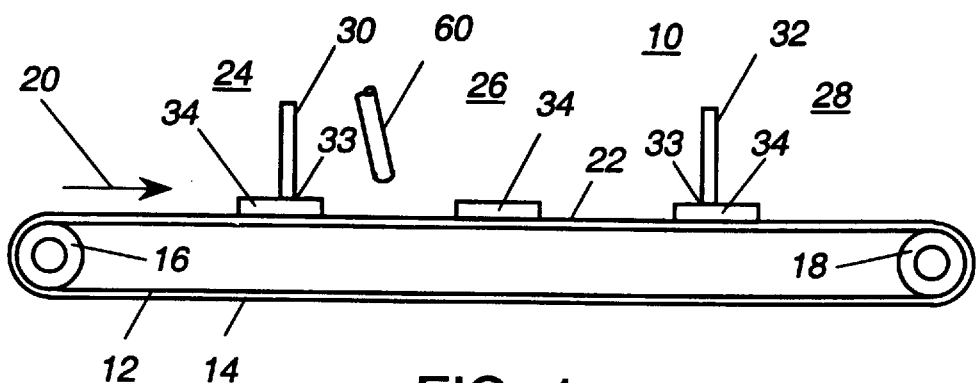
FIG. 1 is an elevational view of an apparatus for forming a substantially uniform coating of a substance on thin sheet material in accordance with a preferred embodiment of the present invention.
Figure 2:
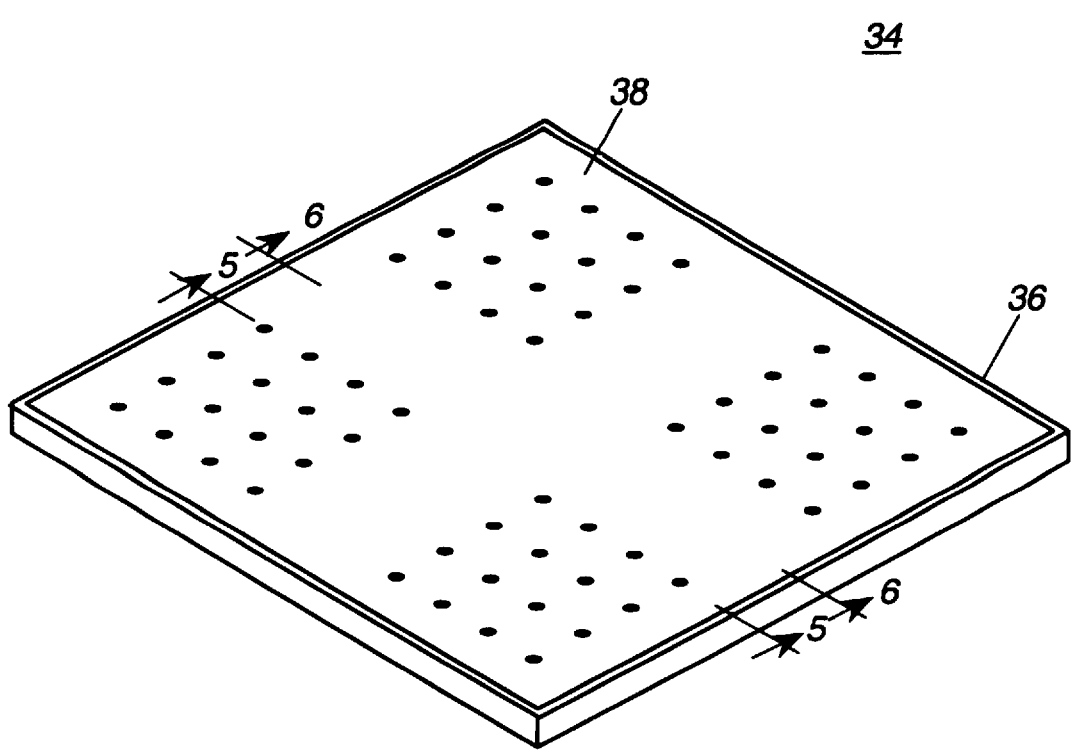
FIG. 2 is a perspective view of a vacuum chuck in accordance with a preferred embodiment of the present invention.

FIG. 1 depicts an apparatus 10 in accordance with a preferred embodiment of the present invention for forming a substantially uniform coating of a substance on a thin sheet material such as a glass substrate. Apparatus 10 includes a conveyor 12 in the form of an endless belt 14 that is wrapped around a driving roller 16 and a driven roller 18. Driving roller 16 is rotated by a drive source (not shown), such as an electric motor, to drive the endless belt 14 in the direction of arrow 20. The upper run 22 of conveyor 12 is divided into a first zone 24, a second zone 26, and a third zone 28 by first baffle 30 and second baffle 32 which are suspended above upper run 22.

Pieces of thin sheet material are processed on apparatus 10 by being conveyed along upper run 22 of conveyor 12 on vacuum chucks 34. As each vacuum chuck 34 is conveyed, it passes through first zone 24, then beneath first baffle 30, through second zone 26, beneath second baffle 32, and through third zone 28. Within each zone 24, 26, 28 the temperature is controlled in accordance with one or more operations to be performed on conveyor 12, such as applying a coating of a substance onto the pieces of thin sheet material. Preferably, the lower edges 33 of baffles 30 and 32 are spaced from upper run 22 by only slightly more than the thickness of the vacuum chucks 34 so as to maintain the desired temperatures in zones 24, 26, and 28.

Figure 3:
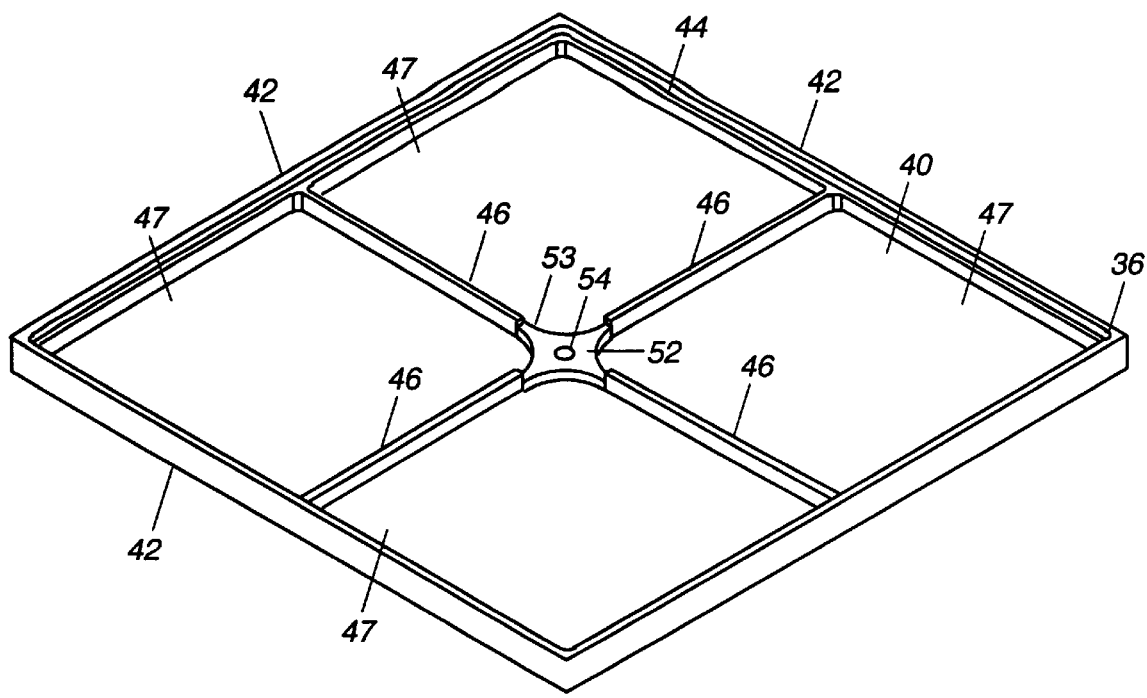
FIG. 3 is a perspective view of a chuck body member suitable for incorporation into the vacuum chuck of FIG. 2.
Figure 4:
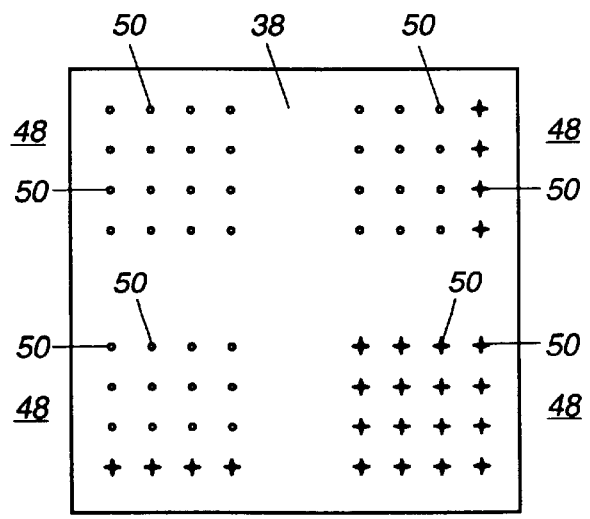
FIG. 4 is a top plan view of a gas-permeable support member usable with the chuck body member of FIG. 3 to form a vacuum chuck such as that of FIG. 2.
Figure 5:
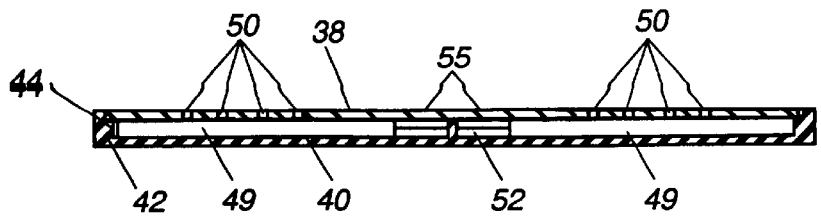
FIG. 5 is a sectional view taken along line 5—5 of FIG. 2.

As seen in FIGS. 2 through 6B, in one preferred embodiment each vacuum chuck 34 includes a chuck body member 36 and a gas-permeable support member 38 that is mounted on the chuck body member 36 to provide a gas-permeable support surface. In the embodiment of FIGS. 2 through 6, chuck body member 36 includes a lower inner surface 40 which is surrounded by raised sides 42 having formed therein mounting edges 44 on which the gas-permeable support member 38 is mounted. A set of inner supports 46 divide chuck body member 36 into four sections 47, as seen in FIG. 3. Within each section 47 a chamber 49 is formed between lower surface 40 and gas-permeable support member 38. As seen in FIG. 4 gas-permeable support member 38 has four or more sets 48 of vacuum openings passing through it, one set 48 overlying each of the sections 47 into which inner supports 46 divide chuck body member 36. In FIG. 4, each set 48 includes four or more rows of vacuum openings 50, each row having four or more openings; however, sets having other numbers of openings could be utilized, as could gas-permeable support members having a greater or lesser number of sets of vacuum openings.

Figure 6A:
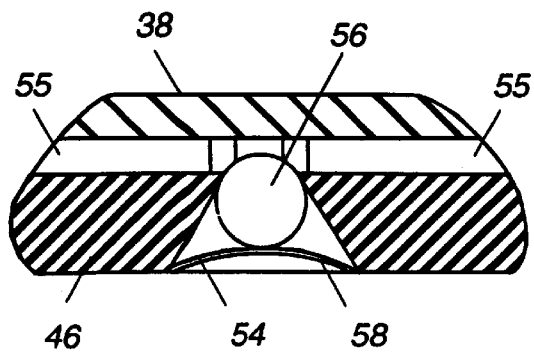
FIG. 6A is a sectional view taken along line 6—6 of FIG. 2.
Figure 6B:
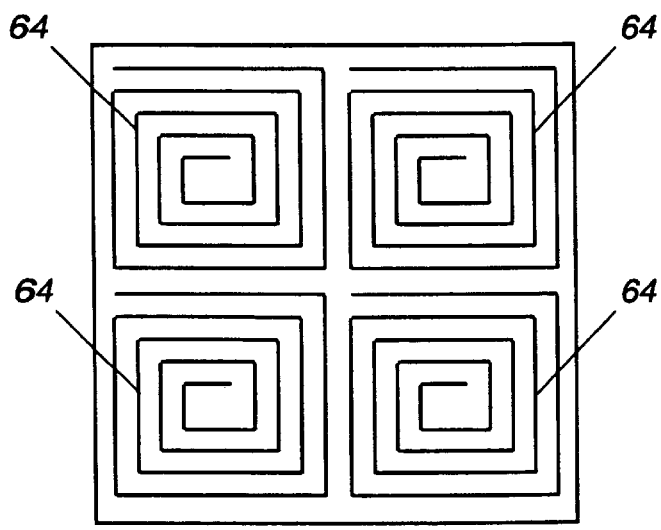
FIG. 6B is an enlarged sectional view of portion A of FIG. 6B.
Figure 7:
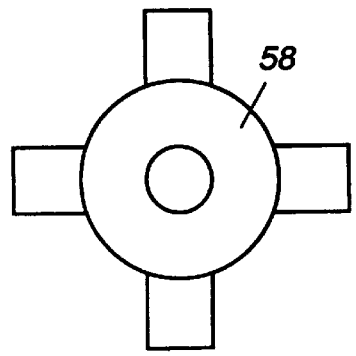
FIG. 7 is a plan view of a locking shim usable in the vacuum chuck of FIG. 2.

As seen from FIG. 3, each of the inner supports 46 extends from an associated side 42 of chuck body member 36 to a central piece 52. Piece 52 does not contact gas-permeable support member 38, but has four projecting ends 53 connecting with the four inner supports 46 and has a central opening 54 passing through it. Central piece 52, gas-permeable support member 38, and inner support members 46 are so designed as to allow air flow passages 55 to connect each chamber 49 with opening 54. As can be seen from FIGS. 6A and 6B, opening 54 tapers outwardly from the inner surface of central member 52 to the outer surface thereof, and a ball-shaped valve member 56 is held within opening 54 by a shim member 58. Valve member 56 is sized such that it completely blocks the inner end of opening 54 when the valve member is held against that inner end by shim member 58. Shim member 58 is a flexible member that is curved to held valve member 56 inwardly, as can be seen in FIG. 6B. FIG. 7 illustrates one embodiment of a shim member 58 suitable for use in a vacuum chuck in accordance with the present invention. Other designs could, of course, be utilized. Preferably, the curvature of shim member 58 increases as the temperature increases. Thus, for example, shim member 58 might be a bi-metallic shim formed of two types of stainless steel having different coefficients of thermal expansion or formed of completely different metals such as copper alloy and steel. Alternatively, shim member 58 can be formed of a single metal and wedged tightly in place.

In manufacturing thin glass solar cell panels utilizing vacuum chuck 34 and apparatus 10, four thin glass substrates are placed over the four sets 48 of vacuum openings 50, and a vacuum source is applied to the lower opening of 54 on the underside of surface 40 and activated. The resulting vacuum causes shim member 58 and valve member 56 to move outwardly within opening 54, permitting the vacuum to be drawn through opening 54, passages 55, chambers 49, and openings 50 to hold the thin sheet material against support member 38. The thin sheet material closes the openings 50, and when the vacuum source is deactivated, shim 58 holds valve member 56 inwardly, closing the inner end of tapered opening 54 to maintain the vacuum, holding the thin glass substrate flat against gas-permeable support member 38 even though the vacuum source is no longer applied to opening 54.

The vacuum chuck with the thin sheet material held thereon is then placed on a conveyor 12 and conveyed through zones 24, 26 and 28 of the processing apparatus, as illustrated in FIG. 1. Even though there is a temperature differential in the various zones, the thin sheet material is held flat by the vacuum chuck. Thus, for example, when the vacuum chuck enters first zone 24, the air temperature in that zone may be in the order of 200° C., and as the vacuum chuck enters second zone 26, the temperature in that zone may be in the order of 600°C. Endless belt 14 moves vacuum chuck 34 at a speed that may be as slow as one foot per minute, or slower. Each thin glass substrate might be in the order of 12 or more inches long and so might take 12 minutes or more to pass beneath first baffle 30 from first zone 24 to second zone 26, and another 12 minutes or more to pass beneath second baffle 32 from second zone 26 to third zone 28. Thus, for a considerable period of time, a significant temperature difference may exist over the surface of the thin glass substrate. In the absence of the vacuum, the thin glass substrate might warp or curl. However, vacuum chuck 34 holds the thin glass substrate substantially flat.

As the thin glass substrates are conveyed through zones 24, 26 and 26, substances can be applied to the exposed surface of each glass substrate, for example, by chemical vapor deposition. In one possible implementation, glass substrates 3 to 5 mils thick and having a conductive tin oxide coating with a thickness in the order of about 5000 angstroms might be conveyed by apparatus 10 through first zone 24 into second zone 26 in which a coating of silicon dioxide with a thickness in the order of about one micron is applied. The coated substrate then passes through third zone 28 and further processed, for example by applying a coating of aluminum with a thickness in the order of about 2000 angstroms. Following processing, valve member 56 is moved outwardly within opening 54, to release the vacuum, and the thin sheet material is removed from support surface 38. For sake of illustration, FIG. 1 depicts a source 60 of a substance to be coated on the thin glass substrate in the second zone 26. If the glass substrates are allowed to warp or curl, the coating will not be uniformly applied; however, because the substrates are held substantially flat on vacuum chuck 38, the coating is applied substantially uniformly.

The process of coating substrates in this manner can involve use of highly corrosive materials and chemicals, and so preferably vacuum chuck 34 and gas-permeable support member 38 are formed of a chloride inert metal such as a 300 series stainless steel, for example a 304 or a 316 stainless steel. Likewise, baffles 30 and 32 are formed of a chloride inert material such as a stainless steel.

Figure 8:
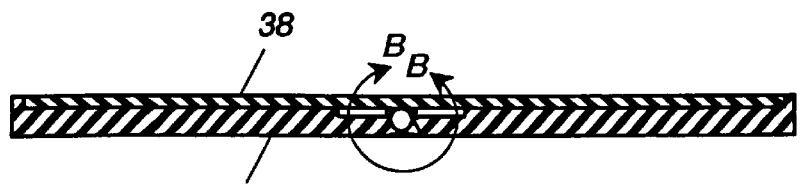
FIG. 8 is a top plan view of an alternative embodiment of a gas-permeable support member usable with the chuck body member of FIG. 3 to form a vacuum chuck in accordance with the present invention.

Gas-permeable support member 38 is only one representative form in which such a support member can be provided. Thus, for example, FIG. 8 depicts an alternative form of a gas-permeable support member in which, rather than four sets of holes, four coil-shaped slits 64 are formed through the support member.

Figure 9:
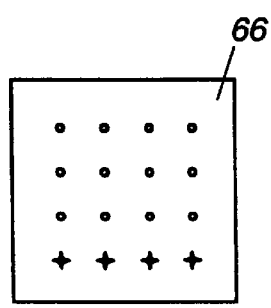
FIG. 9 is a top plan view of another alternative embodiment of a gas-permeable support member usable with a chuck body member to form a vacuum chuck in accordance with the present invention.

Likewise, a vacuum chuck having a greater or a lesser member of sets 48 of holes 50, or sets of slits 64 could be provided, for example, nine sets in three rows of three each, although a square array is not required. A vacuum chuck capable of holding only a single substrate could be provided, such a vacuum chuck utilizing a gas-permeable support member having a single set of holes, such as illustrated by support member 66 in FIG. 9, or having a single coiled slit. In addition, if a circular thin sheet material is being treated, then a circular vacuum chuck could be provided.

A gas-permeable support member can be provided having a plurality of annular microgrooves machined in it which are in fluid communication through microholes with passages 55. A wafer of thin sheet material is supported on the support member, covering all the microgrooves.

While the drawings depict the vacuum chuck formed of a body member and a separate gas-permeable support member that is mounted on the body member, this is for ease of manufacture, particularly when the vacuum chuck is formed of a material such as stainless steel. If a different material, permitting an appropriate manufacturing technique, is utilized, the vacuum chuck could be a single piece having a gas-permeable support surface.

The present invention thus provides an improved vacuum chuck and an improved apparatus for holding thin sheet material. Valve member 56 and shim member 58 permit a vacuum to be maintained within the vacuum chuck without the necessity of retaining opening 54 connected to a vacuum source.

Although the present invention has been described with reference to preferred embodiments, various rearrangements, alterations and substitutions could be made, and still the result would be within the scope of the invention.

What is claimed is:

1. A vacuum chuck for holding thin sheet material, said vacuum chuck comprising:
    a chuck body having a lower surface with an inlet therethrough, a plurality of side surfaces, and a gas-permeable support surface for supporting the thin sheet material, with thin sheet material inhibiting gas flow through said support surface so as to define a vacuum chamber having an inlet;
    a valve member for controlling gas flow through said vacuum chamber inlet; and
    a locking shim for holding said valve member in said vacuum chamber inlet, said locking shim responsive to said vacuum chamber inlet being coupled to a vacuum source for permitting said valve member to partially withdraw from said vacuum chamber inlet, to permit drawing of a vacuum in the vacuum chamber, and responsive to said vacuum chamber inlet being removed from the vacuum source for inserting said valve member more fully into the vacuum chamber inlet, to seal said vacuum chamber and retain the vacuum therein, holding the thin sheet material on said gas-permeable support surface, wherein said locking shim is formed of two layers of material having different coefficients of thermal expansion to cause said locking shim to curve in a preferred direction when heated, more firmly inserting said valve member into said vacuum chamber inlet to more firmly seal said vacuum chamber inlet.

2. A vacuum chuck as claimed in claim 1, wherein said chuck body has a tapered opening through one surface thereof to provide said vacuum chamber inlet.

3. A vacuum chuck as claimed in claim 2, wherein said valve member comprises a ball-shaped valve member having a diameter greater than the diameter of the inner end of said tapered opening and smaller than the diameter of the outer end of said tapered opening.

4. A vacuum chuck as claimed in claim 1, wherein said chuck body comprises a chuck body member having a raised periphery with a mounting edge, and a gas-permeable support member mounted on said mounting edge and within said raised periphery.

5. A vacuum chuck as claimed in claim 1, wherein said support surface is adapted to support a plurality of pieces of thin sheet material.

6. A vacuum chuck as claimed in claim 5, wherein said support surface is substantially square.

7. A vacuum chuck as claimed in claim 1, wherein said support surface is substantially square.

8. Apparatus for forming a substantially uniform coating of material on a substrate, said apparatus comprising:
    a vacuum chuck for holding the substrate, said vacuum chuck including a chuck body having a lower surface with an inlet therethrough, a plurality of side surfaces, and a gas-permeable support surface for supporting the substrate, with the substrate inhibiting gas flow through said support surface so as to define a vacuum chamber having an inlet; a valve member for controlling gas flow through said vacuum chamber inlet; and a locking shim for holding said valve member in said vacuum chamber inlet, said locking shim being responsive to said vacuum chamber inlet being coupled to a vacuum source for permitting said valve member to partially withdraw from said vacuum chamber inlet, to permit drawing of a vacuum in the vacuum chamber, and responsive to said vacuum chamber inlet being removed from the vacuum source for inserting said valve member more fully into said vacuum chamber inlet, to seal the vacuum chamber and retain the vacuum therein, holding the substrate on said gas-permeable support surface, said locking shim being formed of two layers of material having different coefficients of thermal expansion to cause said locking shim to curve when heated, more firmly inserting said valve member into said vacuum chamber inlet to more firmly seal said vacuum chamber inlet;
    a conveyor for conveying said vacuum chuck having the substrate supported thereon through a coating zone; and
    a source of a coating substance in the coating zone, for forming the coating on the substrate.

9. A vacuum chuck as claimed in claim 8, wherein said chuck body has a tapered opening through one surface thereof to provide said vacuum chamber inlet.

10. A vacuum chuck as claimed in claim 9, wherein said valve member comprises a ball-shaped valve member having a diameter greater than the diameter of the inner end of said tapered opening and smaller than the diameter of the outer end of said tapered opening.

11. Apparatus as claimed in claim 8, wherein said chuck body member has a raised periphery with a mounting edge, and said gas-permeable support member is mounted on said mounting edge and within said raised periphery.

12. A vacuum chuck as claimed in claim 8, wherein said support surface is adapted to support a plurality of pieces of thin sheet material.

13. A vacuum chuck as claimed in claim 12, wherein said support surface is substantially square.

14. A vacuum chuck as claimed in claim 8, wherein said support surface is substantially square.

* * * * *